(12) United States Patent
Maes

(10) Patent No.: US 9,966,510 B2
(45) Date of Patent: May 8, 2018

(54) SIGNALING SYSTEM HAVING IMPROVED CONTRAST RATION

(76) Inventor: Marcel Peter Gerard Maes, Simpelveld (NL)

( * ) Notice: Subject to any disclaimer, the term of this patent is extended or adjusted under 35 U.S.C. 154(b) by 940 days.

(21) Appl. No.: 13/502,565

(22) PCT Filed: Oct. 30, 2009

(86) PCT No.: PCT/EP2009/064402
§ 371 (c)(1),
(2), (4) Date: Apr. 18, 2012

(87) PCT Pub. No.: WO2011/047739
PCT Pub. Date: Apr. 28, 2011

(65) Prior Publication Data
US 2012/0218754 A1    Aug. 30, 2012

(30) Foreign Application Priority Data
Oct. 22, 2009 (EP) ..................... 09173846

(51) Int. Cl.
*H01L 33/58* (2010.01)
*G08G 1/095* (2006.01)
(Continued)

(52) U.S. Cl.
CPC ............. *H01L 33/58* (2013.01); *G08G 1/095* (2013.01); *F21S 43/14* (2018.01); *F21Y 2115/10* (2016.08); *H01L 33/46* (2013.01); *H01L 33/483* (2013.01)

(58) Field of Classification Search
CPC ...... F21S 48/145; F21S 48/1159; F21S 43/14; H01L 33/58; H01L 33/46; H01L 33/483; G08G 1/095; F21Y 2115/10
(Continued)

(56) References Cited

U.S. PATENT DOCUMENTS 6,364,507 B1    4/2002  Yang
7,559,673 B2 *  7/2009  Meersman et al. ........... 362/245
(Continued)

FOREIGN PATENT DOCUMENTS

DE    102005021704 A1    11/2006
EP    0962911 A2    12/1999
WO    2006105731 A1    10/2006

*Primary Examiner* — Bao Q Truong
(74) *Attorney, Agent, or Firm* — David Guerra

(57) ABSTRACT

The invention relates to a signaling system comprising at least one light-emitting device (1) for showing a signal or warning to a viewer (99), wherein, in operational use, the light-emitting device (1) is configured for emitting radiation with a light distribution forming a solid angle in space, wherein a center line of the solid angle is defined as an optical axis (Z) of the light-emitting device (1). The light-emitting device (1) comprises a transparent housing (3), a reflector (5) and a light-emitting part (7) arranged within the housing (3), wherein the reflector (5) and the light-emitting part (7) are configured for generating the radiation with said light distribution. The signaling system further comprises blocking means (10) are arranged substantially at one side of the light-emitting device (1). The blocking means (10) are configured for individually blocking, in operational use, at least part of the radiation emitted by the light-emitting device (1) in a direction substantially parallel to the optical axis (Z), wherein the one side is defined with respect to a fictitious plane through the optical axis (Z). The invention further relates to various applications of such signaling system. Despite the lower luminance of the light-emitting device, the invention provides for a higher-contrast ratio in case of a low-angled sun with respect to the optical axis (Z).

20 Claims, 9 Drawing Sheets

(51) Int. Cl.
*H01L 33/46* (2010.01)
*H01L 33/48* (2010.01)
*F21Y 115/10* (2016.01)

(58) Field of Classification Search
USPC .... 362/23.07, 23.14, 235, 244, 247, 249.01,
362/249.02, 290, 296.01, 341, 351, 812,
362/248, 539
See application file for complete search history.

(56) References Cited

U.S. PATENT DOCUMENTS

| | | | |
|---|---|---|---|
| 2003/0107323 A1* | 6/2003 | Stam | F21S 48/1159 315/82 |
| 2005/0180144 A1* | 8/2005 | Stout | F21S 48/1773 362/307 |
| 2006/0138440 A1 | 6/2006 | Jyo | |
| 2007/0247865 A1* | 10/2007 | Kinoshita | F21S 48/145 362/538 |
| 2008/0175017 A1* | 7/2008 | Terada | B60Q 1/0041 362/539 |
| 2009/0251741 A1* | 10/2009 | Sheng et al. | 358/475 |

* cited by examiner

SIGNALING SYSTEM HAVING IMPROVED CONTRAST RATION

CROSS-REFERENCE TO RELATED APPLICATIONS

This application is an U.S. national phase application under 35 U.S.C. § 371 based upon co-pending International Application No. PCT/EP2009/064402 filed on Oct. 30, 2009. Additionally, this U.S. national phase application claims the benefit of priority of co-pending International Application No. PCT/EP2009/064402 filed on Oct. 30, 2009 and Application No. EP 09173846.8 filed on Oct. 22, 2009. The entire disclosures of the prior applications are incorporated herein by reference. The international application was published on Apr. 28, 2011 under Publication No. WO 2011/047739 A1.

FIELD OF THE INVENTION

The invention relates to a signaling system comprising at least one light-emitting device for showing a signal or warning to a viewer. The invention further relates to a blocking means for use in such signaling system. The invention also relates to various embodiments of the signaling system, such as traffic signaling applications. The invention also relates to a vehicle comprising such signaling system.

BACKGROUND OF THE INVENTION

Standard signaling systems, such as signaling systems based on light-emitting diodes (LED's), are very hard to read/see when illuminated by sunlight under a low-angled sun (such systems are typically oriented vertically when used in traffic). All inexpensive standard plastic LED's, such as 3, 5, 8, 10 mm, round or oval shaped LED's, comprise an embedded plastic lens and internal reflector which are arranged for beaming the emitted light straight to the viewer (under various angles of +/−1o 180 degrees horizontal or vertical depending on the model). But these standard plastic LED's are also reflecting sunlight to the viewer when the sun is in the optic view angle of this particular LED. The reflection of the sun in a standard LED is higher than white paper in the sun and thus making correct signaling very hard. Only a high LED current and strong LED's can overcome the sun's reflection, but this is at higher initial investment and a shorter operational lifespan. Hood type LED masks have been reported which limit the viewing angle of the display. The disadvantage of these masks is that they are only effective if the angle of the sunlight is relatively large, i.e. 20 degrees or more with respective to the optical axis. More complex solutions have been reported also.

U.S. Pat. No. 8,249,375 B1 discloses an optical element for changeable traffic signs consisting of a light source, in particular, a light-emitting diode (LED), at least one converging lens and one diverging lens, which are arranged coaxially in a shared housing. The light exiting from the light source is captured as completely as possible by the converging lens, concentrated in a focal spot, which is preferably surrounded by a diaphragm and directed further onto the diverging lens which distributes it according to certain specifications. The refracting power of the diverging lens is dimensioned such that light exiting from it features a smaller angle of exit beta than a prescribed limit angle alpha. The distance between the converging lens and the diverging lens is dimensioned such that sunlight incident from the outside at an angle gamma greater than or equal to the limit angle alpha is completely blocked, either by the diaphragm or by absorption on the housing wall, so that no phantom light is generated.

A problem of the changeable traffic sign in U.S. Pat. No. 6,249,375 B1 is that the system is relative complex and thereby costly. For instance, an additional housing, with a pair of lenses and a diaphragm is required for each LED. Moreover, the relative placement of those parts has to be carefully taken care of also.

SUMMARY OF THE INVENTION

It is a first object of the invention to provide an alternative signaling system, which is less complex, and thereby less expensive. It is a second object of the invention to provide a blockage means for use in such system.

The invention is defined by the independent claims. The dependent claims define advantageous embodiments.

In a first aspect, in accordance with the first object, the invention relates to a signaling system as claimed in claim 1.

The effect of the features of the invention is as follows. The blocking means are arranged for covering part of the light distribution of the light-emitting device. It must be noted that this is a counter-intuitive measure, since the person skilled in the art knows that because of the blockage means the light-emitting device will emit less light. However, the inventor has realized, that, besides this effect, at the same time the blocking means reduces, in operational use, sunlight that is incident from an angle with the optical axis reaching the reflector and being reflected in the viewing direction to the viewer which is substantially parallel to the optical axis in normal operational use. So, despite the lower light output level the viewer will experience a higher contrast ratio, and thus the signal or warning will be observed more clearly and sooner in case of a low-angled sun. In other words, the invention achieves a similar effect as in U.S. Pat. No. 6,249,375 B1, but without requiring any lenses or diaphragms. Instead, a simple cover or hood for partly blocking light emitted from the light-emitting device may suffice. Another major difference between the invention and the prior art is that the at least one light-emitting device are each provided with blocking means for individually blocking the emitted light. In the prior art solutions exist with hood which protect all light-emitting devices jointly from incident sunlight. First of all, this is not a matter of individual blocking the light-emitting devices. Secondly, these solutions do not block part of the radiation emitted by the light-emitting device in directions parallel to the viewing direction (so in the direction of the viewer). With the viewing direction is meant the range of normal viewing directions in operational use, which means a viewer who is looking from a certain distance from a direction making a small angle with the optical axis. What is not meant is that the system is viewed from a position oriented substantially vertical w.r.t. the signaling system at the side where the blocking means (per light-emitting device) are provided.

The location and the coverage of the blocking means on the transparent housing may be varied as long as sunlight is being prevented from reaching the reflector in the light-emitting device. Besides, the evident simplicity of the signaling system of the invention, there are other important advantages. The higher contrast ratio allows for the reduction of the steering current through the light-emitting device (an environmental-friendly/green solution) and an increase of the lifetime of the light-emitting device, which reduces the cost of the system even more.

In an alternative formulation it can be stated that, in the invention, the blocking means overlap with the light emitting device when projected into a direction of the optical axis onto a surface perpendicular to the optical axis.

Here must be noted however, that the solution presented in U.S. Pat. No. 6,249,375 B1 has higher optical losses in the external lens system and aperture. The invention requires no external lenses and does therefore not suffer from optical losses; all light which is not blocked by the blocking means is effectively used. This is particularly useful for near viewers watching under a wide viewing angle (say 20-90 degrees from the left, from the right or from the bottom). U.S. Pat. No. 6,249,375 B1 lens systems can not be seen at all beyond the rated view angle. The invention on the contrary provides for a high contrast ratio even at lower angles. Expressed differently, the increase of the contrast ratio compensates for the light output power (luminance) decrease even at coverage levels up to about 80% depending on the light-emitting device type (such as LED)! In an embodiment of the system the blocking means (such as a cover mask) would cover about 30 to 50% of the rated LED viewing angle facing up to the sun (also referred to as half dome). The cover mask can also be used to optimize the viewing angle of the system. Typically the viewing angle of a covered LED (means the angle within the luminance output is 50%) will increase about 30% compared to the rated specification of the LED!

In the discussion of the embodiments it is assumed that the signaling system has a vertical orientation (optical axis of light-emitting device oriented horizontally), i.e. that it is being viewed from a substantially horizontal direction. Such orientation is typical for signaling systems in used in traffic. However, it must be noted that the invention is applicable in a much broader sense. The invention provides for a solution in outdoor situations where bright sunlight hampers vision of the sign, but also in situation where another bright light source (which may be inside) hampers vision of the sign. Orientations of the signaling system are not limited to vertical orientations only. Where the word "angle" or "angle of incidence" is mentioned, this angle is defined with respect to the optical axis of the light-emitting device.

US 2006/138440 A1 discloses a light-emitting diode lamp having a light-emitting diode chip mounted on a cup-shaped mounting portion of a lead frame. The mounting portion is formed at one end of a lead portion of the lead frame. The light-emitting diode chip and the mounting portion are embedded in a convex shape lens made of a resin. The lead frame has a hood portion serving as a reflector. The hood portion downwardly reflects the outgoing beam of the light-emitting diode chip and also shields external incident light obliquely from the upper side. It is rendered possible to increase the luminous efficiency in the downward direction, improve the visibility from the lower side and increase the luminous efficiency in the desired direction without any combination of complicated lens configurations.

In an embodiment of the signaling system in accordance with the invention the blocking means are configured for blocking between 1% and 99%, and preferably between 30% and 50%, of the light distribution. The inventor has discovered that there is a relatively large range of the coverage in which the contrast ratio increase compensates for the lower light output power (luminance). It is observed that the following rule is valid for a relative large sub-range within the above-mentioned range; the larger the coverage, the higher the contrast ratio observed by the viewer at sunlight incident from small angles with respect to the optical axis, i.e. less sunlight will reach the reflector and be reflected to the viewer increasing the contrast ratio of the signal or warning being shown to the viewer. For example, experiments have shown that a 40% coverage of one side of the light distribution of a LED device under low angled sun (+10 degrees of the reference axis of the LED (the LED has 60% of the normal luminance in that case) reduces the reflection of a low angled sun 16 times (from 10.000 to 650 $Cd/M^2$) and boosts the overall contrast ratio of the same LED at least 7 times).

In an embodiment of the signaling system in accordance with the invention the blocking means are configured for blocking the radiation emitted in directions falling within a solid angle centered around the optical axis and the normal horizontal or vertical viewing angle around the optical axis of the light-emitting device. This embodiment provides for a high contrast ratio even in case of sunlight incident from very small angles (e.g. smaller than 10 degrees). The blocking light emitted in the directions of the optical axis and the solid angle around this optical axis, defined by the viewing angles, prevents sunlight from reaching the reflector even if the sun is positioned just above the horizon, i.e. a very small angle of incidence.

In an embodiment of the signaling system in accordance with the invention the blocking means are configured for an adjustable blockage of the light distribution. By adjusting of the blockage of the light distribution the signaling system may be adapted to a specific season, a specific location, a specific time slot of the day, a specific viewing angle or a desired uniformity of the emitted light within the viewing angle of the system (50% angle)

In a further variation of last-mentioned embodiment the adjustable blockage of the light distribution is adaptive such that it depends on an angle of incidence of the sun, wherein the coverage is increases with a decreasing angle of incidence, wherein the angle of incidence is defined with respect to the optical axis.

In an embodiment of the signaling system in accordance with the invention the blocking means are configured for redirecting incident sunlight in a direction different than the viewing direction.

In an embodiment of the signaling system in accordance with the invention the blocking means are configured for scattering incident sunlight. In a first variant of this embodiment the blocking means comprises scattering material, and in a second variant the blocking means comprises scattering layer.

In an embodiment of the signaling system in accordance with the invention the blocking means are configured for absorbing incident sunlight. In a first variant of this embodiment the blocking means comprises absorbing material, and in a second variant the blocking means comprises absorbing layer.

The effect of the embodiments as defined in claims 6 to 8 and their variants is similar, namely that less light will be reflected towards the viewer, and thus a higher contrast ratio is achieved. The advantage of the embodiments of claims 7 and 8 is that they operate better at sunlight incident with a very small angle with respect to the optical axis.

In an embodiment of the signaling system in accordance with the invention the blocking means are provided with a further reflector at an inner side facing the reflector, wherein the further reflector is configured for reflecting radiation emitted by the light-emitting device towards the reflector. The further reflector can be a reflective layer provided on the outside of the transparent housing or on the inside of the blocking means, but it may also be located at other locations. This embodiment is very advantageous, because it tackles the earlier described effect of the lower luminance when covering the light-emitting devices. Light which otherwise would have been lost is now redirected to the reflector and at least partially reflected towards the viewer. In other words, the luminance is increased, which further increases the contrast ratio. This higher contrast ratio may be exploited to further reduces the driving current of the light-emitting device, which results in an even longer life span.

In an embodiment of the signaling system in accordance with the invention the blocking means comprise a cover mask, which is not transparent for visible light, wherein the cover mask is removably attached to the signaling system. The cover mask can be manufactured and sold independently from the light-emitting devices or the signaling system. Furthermore, the cover mask enables the use of conventional light-emitting devices. Expressed differently, the invention can be implemented by providing a cover mask in addition to a conventional signaling system. To achieve that the cover mask must be designed for the signaling system on which it is used, i.e. it must at least take into account the location, shape, size, and the number of light-emitting devices.

In an embodiment of the signaling system in accordance with the invention the blocking means comprise a blocking layer that is provided directly on or within the transparent housing of the light-emitting device, wherein the blocking layer is not transparent for visible light. In this embodiment the light-emitting devices are adapted in accordance with the invention. Such light-emitting device then has an asymmetric light distribution and must be mounted in a signaling system taking into account the orientation of this light distribution. The combination of the light-emitting device and the blocking layer forms an entity, which can be sold separately. The invention can be implemented by replacing light-emitting devices in existing systems with the light-emitting device of the invention. In a first variant the blocking layer is an add-on to the existing light-emitting device, which can be removable attached to it. In a second variant the blocking layer may form part of the light-emitting device in a fixed manner. In this variant the blocking layer may be deposited on the transparent housing as a last stage of the manufacturing process, but it may also be provided within the transparent housing.

In an embodiment of the signaling system in accordance with the invention the blocking means comprise, on a side facing the viewer, a material that is non-reflective and, preferably, dark-colored in daylight. The non-reflective properties, optionally combined with the dark color of the blocking means (which is visible from the front-side), increase the contrast ratio of the signaling system. Preferably, the blocking means is black-colored.

In an embodiment of the signaling system in accordance with the invention the at least one light-emitting device comprises an array of light-emitting devices for forming a sign or symbol in operational use, and each respective one of the light-emitting devices comprises a respective transparent housing, a respective reflector and a respective light-emitting part arranged within the respective housing, wherein the reflector and the light-emitting part are configured for generating respective radiation with said light respective light distribution, and the blocking means are arranged at one side of each respective one of the light-emitting devices, the blocking means being configured for individually blocking, in operational use, at least part of the radiation emitted by the light-emitting devices in a direction substantially parallel to the optical axis, wherein the one side is defined with respect to the optical axis. In order to make a sign or symbol multiple light-emitting devices are to be arranged in a matrix, wherein each light-emitting device acts as a pixel. The invention is also applicable to such configuration. It must be noted that here the invention clearly distinguishes itself from the prior art in that each light-emitting device is individually provided with blocking means, which is clearly different from a hood that is shared by a matrix of light-emitting devices.

In an embodiment of the signaling system in accordance with the invention the at least one light-emitting device comprises a light-emitting diode. Light-emitting diodes are commonly used for signaling applications. However, the invention is not limited to this kind of devices per se. Any light-emitting device having a light-emitting part and a reflector may suffer from the same problem when used in a signaling system, where the invention provides a solution.

An embodiment of the signaling system in accordance with the invention is constructed to form a system selected from a group comprising: road side signal, traffic light, traffic warning system, rail level crossing sign, wayside signal, highway information system, advertising display, vehicle turn indicator, vehicle brake light, vehicle tail light, and vehicle navigation light. The applications mentioned here all benefit from the higher contrast ratio in case of sunlight incident from an angle with respect to the optical axis. However, the invention is not limited to these applications.

In an embodiment of the signaling system in accordance with the invention the light-emitting device comprises the blocking means. This light-emitting device (such as a LED) can be sold as a separate entity and replace the LED's in existing signaling systems.

In a second aspect, in accordance with the second object, the invention relates to the blocking means for use in the signaling system in accordance with the invention. In this embodiment the blocking means can be provided as an add-on to conventional signaling systems. The embodiment is particularly interesting in embodiments where an array of LED's shares the cover mask, which acts as the blocking means.

In a third aspect, in accordance with the second object, the invention relates to a vehicle comprising the signaling system in accordance with the invention. Nowadays, even vehicles are provided with LED lights, i.e. front-lights, back-lights, and vehicle-turn lights. The invention increases the contrast ratio also in these kind of signaling systems. As a consequence light output power (luminance) may be reduced by reducing the input current, which saves power and thus also fuel. More importantly, the life span of the LED lights may be increased.

These and other aspects of the invention are apparent from and will be elucidated with reference to the embodiments described hereinafter.

LIST OF REFERENCE NUMERALS

Figure 1A:
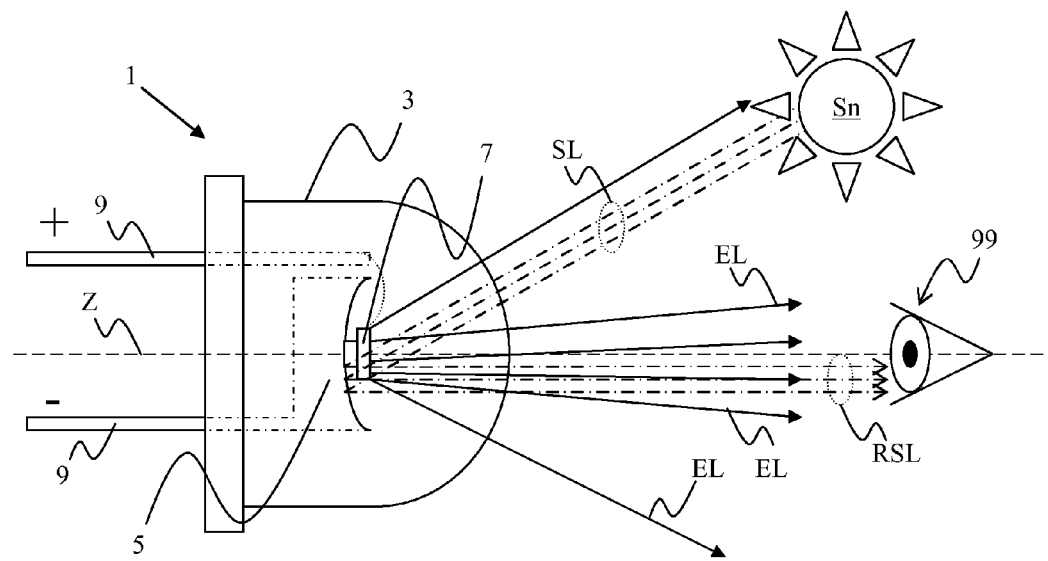
FIG. 1a shows a signaling system as known from the prior art.

1 LED
2 opening in cover mask for receiving LED
3 transparent housing, plastic lens
5 reflector (support for LED)
7 light-emitting part (such as a light-emitting diode)
9 connection terminals
10 blocking means/block layer/cover mask
X x-axis (perpendicular to optical axis and to y-axis)
Y y-axis (perpendicular to optical axis and to x-axis)
Z optical axis (perpendicular to x-axis and y-axis)
99 eye of viewer
Sn sun
SL sunlight
RSL reflected sunlight (via reflector 5)
EL emitted light beam (by LED)
RSL' reflected/diffracted sunlight (via blocking means 10)
SL' part of sunlight that does not reach the reflector
R1 first region with red-colored LED's
R2 second region with red-colored LED's
R3 third region with red-colored LED's

DETAILED DESCRIPTION OF THE PREFERRED EMBODIMENT

In order to facilitate the discussion of the detailed embodiments a few expressions are defined hereinafter.

Led information/indication systems are very common in the public area like road side signals, traffic lights and warning systems, rail level crossings and wayside signals, highway information systems (VMS), advertising (video) displays but also systems like vehicle turn indicators and brake/tail/navigation lights.

Standard LED systems are very hard to read/see when illuminated under low angled sun. All inexpensive standard plastic LED's (like 3, 5, 8, 10 mm and round or oval shaped) with an embedded plastic lens and internal reflector are configured for beaming the LED photoelectric emitted light straight to the viewer (under an angle of 1° to 180° horizontal or vertical depending on the model). These standard plastic LED's are also reflecting sunlight to the viewer when the sun is in the optic view angle of this particular LED. The reflection of a standard plastic LED is higher than white paper in the sun and thus making correct signaling very hard. Only a high LED current and strong LED's can overcome the sun's reflection but at higher initial investment and a shorter operational lifespan. Normal hood type LED masks limit the view angle of the display and are only effective if the sunlight angle is over 30° up.

The inventor has discovered that covering the surface of a LED improves the contrast ratio, despite the fact that the luminance of the LED is decreased. The principle behind the invention is that the ambient sunlight will NOT reach the optical focal point of the LED so it cannot be reflected to the viewer. A part of the LED will be covered. Many different covers are possible.

FIG. 1a shows a signaling system as known from the prior art. The signaling system in FIG. 13 comprises a LED 1, but it may also comprise a matrix of LED's for forming a sign or signal. The principles remain the same as for a single LED. The LED comprises a transparent housing 3, of which a front-part may also act as a lens for the LED. Within the transparent housing 3 there is a reflector 5, and a light-emitting part 7, such as a light-emitting diode. The light-emitting part 7 is connected with terminals 9 for featuring driving a current through the light-emitting part 7. The reflector 5 (which also has a support function in this embodiment), the light-emitting part 7 and the transparent housing 3 are arranged for forming, in operational use, an emitted light beam EL that forms solid angle in space. For the purpose of this invention a center of this solid angle is defined as the (fictitious) optical axis Z A viewer's eye 99 is positioned on the optical axis Z for perceiving the emitted light beam EL. Under cloudy or dark conditions the signaling system of FIG. 1a operates satisfactorily. However, when there is a sun Sn radiating sunlight SL from under small angles with the optical axis Z, this part of sunlight SL may reach the reflector 5 and be reflected towards the viewer's eye 99. Due to the good reflection properties of the reflector 5 this reflected sunlight RSL may easily reach luminance levels that are higher than the luminance of the emitted light EL. As a result the contrast of the sign or signal perceived by the viewer's eye 99 is worsened, or the sign or signal may no longer be perceived at all.

Figure 1B:
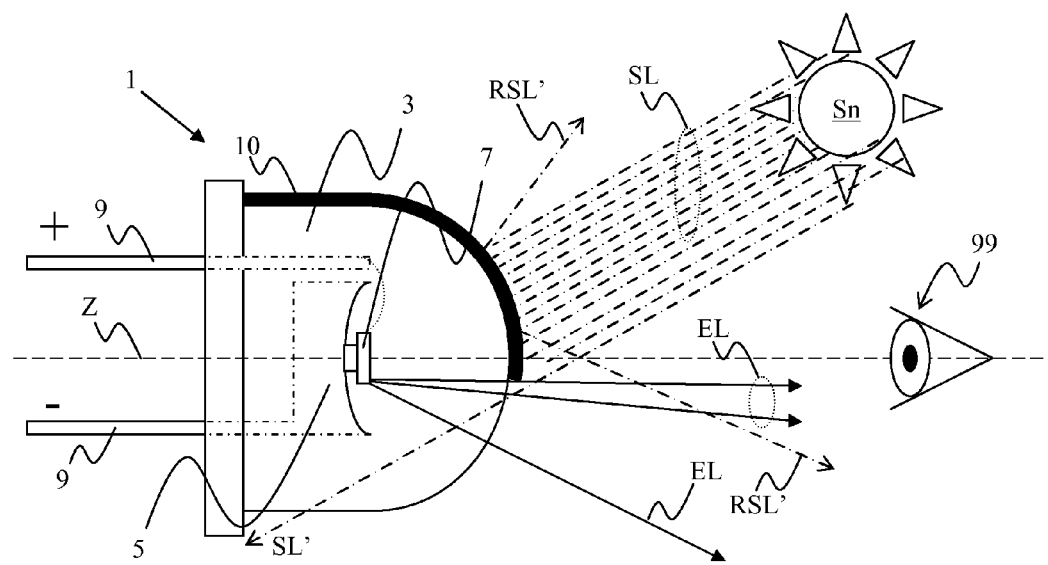
FIG. 1b shows an embodiment of the signaling system in accordance the invention.

FIG. 1b shows an embodiment of the signaling system in accordance with the invention. This signaling system in accordance with the invention differs from FIG. 1a in that blocking means 10 are provided on the transparent housing 3. In this embodiment the blocking means 10 is a cover. It must be noted that only a cross-section of the cover 10 with the plane of the paper has been drawn. In reality the cover 10 is a 3-dimensionally shaped object, which covers the LED 1 along a significant part of the surface. The cover 10 can be added in the LED factory (embedded inside every LED) or added in the housing/assembly on or above the surface of the LED 1 via a mask, film, resin, glue, plastic, metal or other cover. The cover 10 will partly (1-99%) block the normal up and/or side view angle of the LED 1 (in-sight). Although the photoelectric luminous output is reduced the cover 10 will dramatically improve the contrast by blocking the sun/ambient light SL, which improves the visibility under low-angled sunlight. Experiments have shown that a 40% blocking (in-line) cover mask (the LED has 60% of the normal luminance without the cover mask) can boost the contrast of the sign more than 7 times. The visibility of the system is improved. This improvement may also be exploited for reducing the electric driving currents, which then boosts the expected lifespan of the LED's and thereby the system.

In the invention, the blocking means (such as a cover mask) overlap with the light emitting device when projected into a direction of the optical axis onto a surface perpendicular to the optical axis. In the invention any kind of cover shape can be used but a sphere shape like the LED front surface is recommended as it will diffract the ambient light in all directions, and not focusing and reflect the light to the viewer's eye 99. In order not to obtain reflections reaching the viewer's 99 there are three main options: 1) scattering of the incident sunlight SL (in all directions), 2) reflecting incident sunlight SL in directions other than the viewing direction, and 3) absorbing incident sunlight SL. The third option may also be combined with the first or the second option. The reflection/absorption/diffraction properties may be realized by the main material composition of the blocking means 10, but also layers with further materials having these properties may be added to the blocking means 10.

In FIG. 1b there is illustrated reflected sunlight RSL' which is directed into other directions that the viewer's eye. This is to illustrate the scattering principle of some embodiments of the invention as well as the reflection principle of other embodiments. Also, in FIG. 1b some sunlight SL is simply stopped at the cover 10, which illustrates the absorption principle. In order to achieve absorption the cover 10 is preferably dark-colored, and even more preferably black-colored for daylight. In FIG. 1b there is also illustrated a part of the sunlight SL' which reaches the LED 1 but passes the reflector. This part of the light will not harm the contrast ratio of the signaling system.

In FIG. 1b the blocking means 10 are provided directly on the transparent housing 3, but this is not essential. What is important is that part of the light distribution pattern of the LED 1 is blocked. Here, it must be noted that the prior art solutions all try to maximize the light output of the LED, and definitely not block the light being emitted into the direction of the viewer! Obviously, in order to prevent sunlight from reaching the reflector 5 in the transparent housing 3 it is best to provide the blocking means 10 as close to the LED as possible or even within the LED. This may be advantageous for cooling purposes as well, i.e. air may flow between the LED and the blocking means 10.

Figure 2:
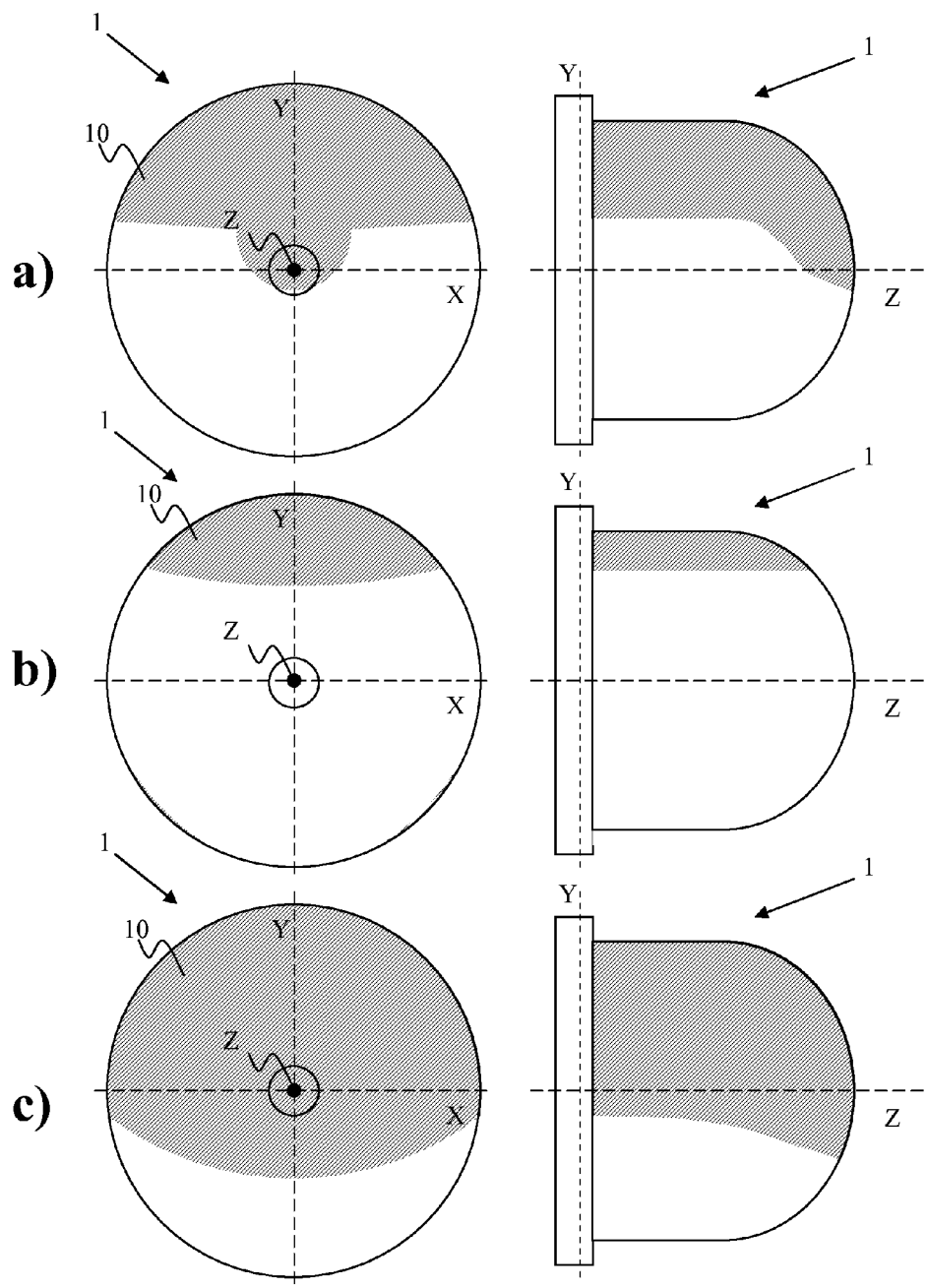
FIGS. 2a to 2c show three different embodiments of the signaling system in accordance with the invention.

FIGS. 2a to 2c show three different embodiments of the signaling system in accordance with the invention. The figures schematically illustrate a front-view and a side-view of the LED 1 in accordance with different implementations of the cover 10. FIG. 2a illustrates an LED 1 with a cover 10 that blocks about 30% of the light distribution. FIG. 2b illustrates an LED 1 with a cover 10 that blocks about 10% of the light distribution. FIG. 2c illustrates an LED1 with a cover that blocks about 60% of the light distribution. In all three embodiments the cover is at a top-side of the LED 1, which is the side, which is selected to be directed to the sun Sn when the LED 1 is used in its application. A larger coverage of the cover 10 results in a smaller the luminance of the LED 1. However, it also makes the system more tolerant for smaller angles of the incident sunlight SL. The trick behind the invention is that the partial blocking of the light distribution at the same time blocks the incident sunlight preventing it from reaching the reflector.

It must be noted that both FIGS. 2a and 2c illustrate a cover 10, which also covers an area around the optical axis when projected onto the XY plane. The advantage of this is that the contrast ratio is still acceptable when the angle with the optical axis is almost zero (in traffic situations this complies with a vertically oriented signaling system while the sun Sn is just above the horizon). In such situation the sunlight is still blocked by the extension of the cover 10 over the area around the optical axis Z. These embodiments are particularly advantageous in case the cover 10 is dark or black-colored and with a scattering front-surface.

Figure 3:
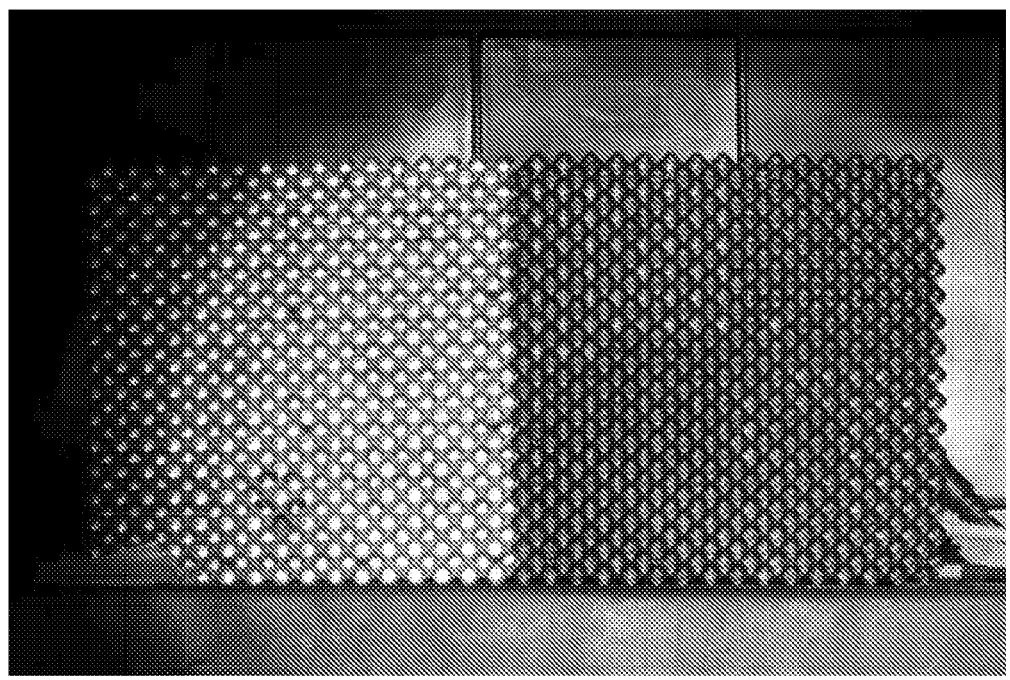
FIG. 3 shows a photograph of two different matrix LED modules arranged side-by-side which illustrate the effect of the invention.
Figure 4A:
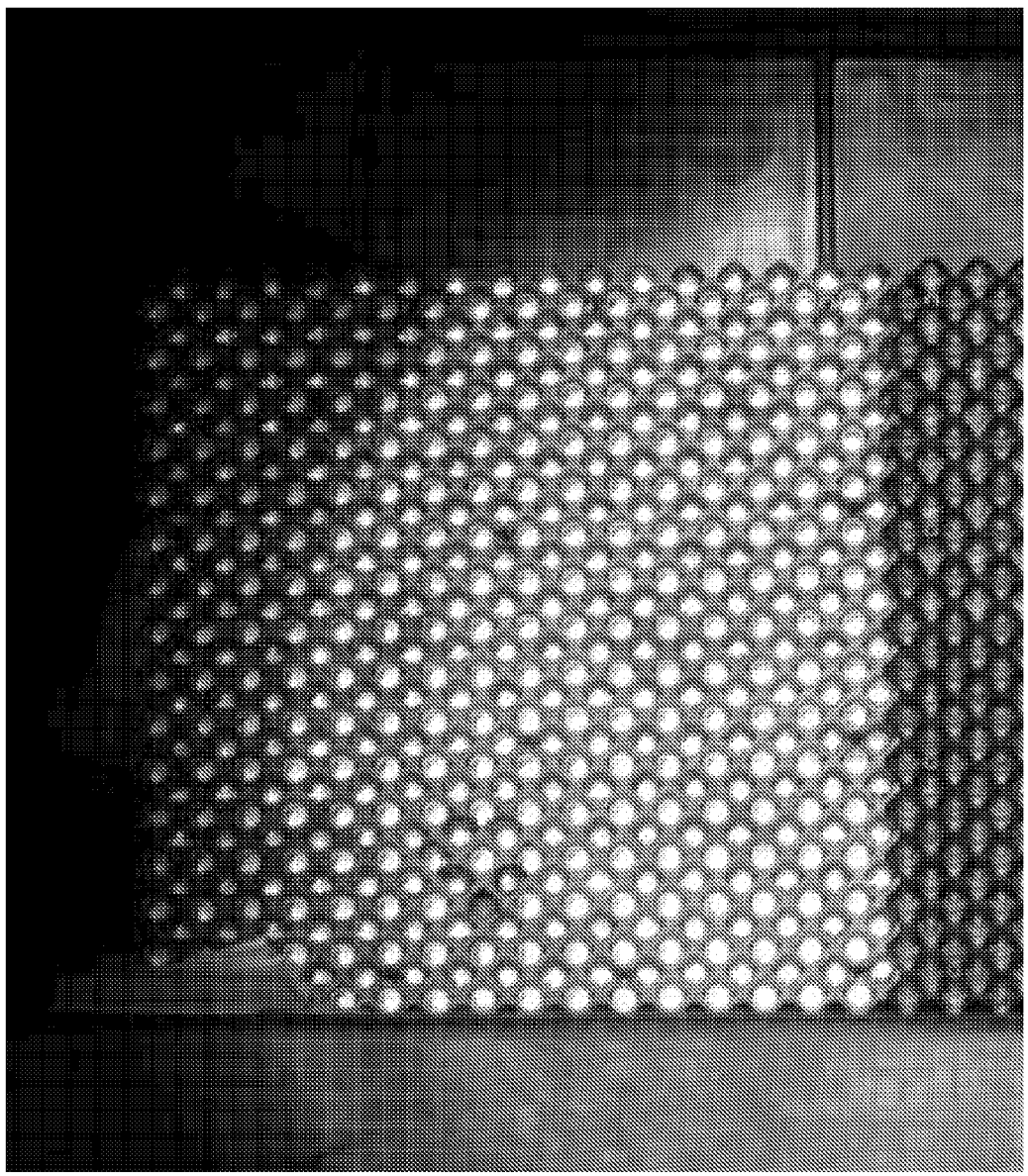
FIG. 4a shows a zoom view of the left matrix LED module of FIG. 3, which is with a conventional hood type mask.
Figure 4B:
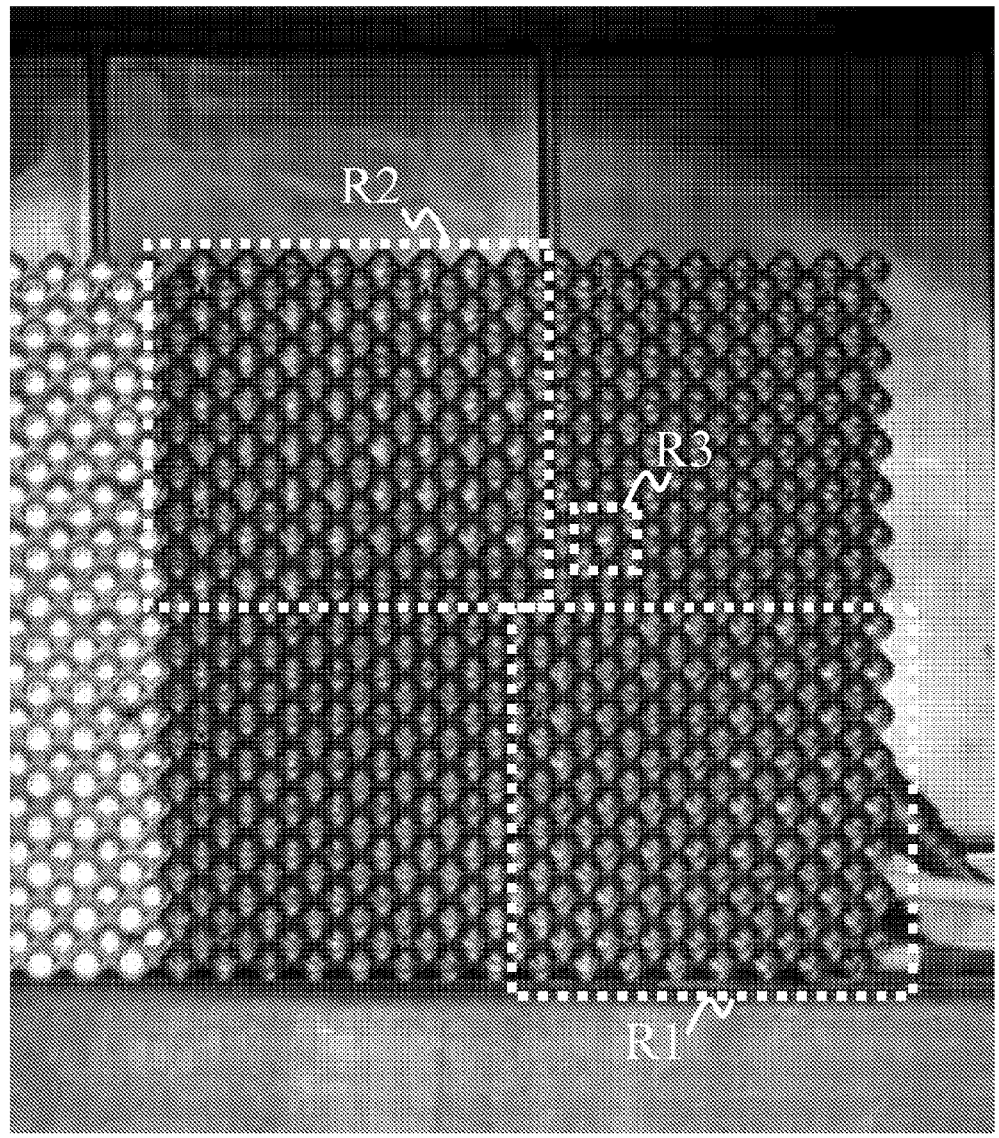
FIG. 4b shows a zoom view of the right matrix LED module of FIG. 3, which is with a cover mask in accordance with the invention.

FIG. 3 shows a photograph of two different matrix LED modules arranged side-by-side which illustrates the effect of the invention. FIG. 4a shows a zoom view of the left matrix LED module of FIG. 3, which is with a conventional hood type mask. FIG. 4b shows a zoom view of the right matrix LED module of FIG. 3, which is with a cover mask in accordance with the invention. These figures show two examples of a matrix LED module having 5 mm LED's with a Pitch of 10 mm, which are illuminated under a 40.000 LUX light source under a 10° angle with the optical axis of the LED's. The left module (FIG. 4a) is a version with a standard hood type mask (the hoods point about 4 mm out above each LED). The right module is an example of the invention with a cover 10 covering 40% of the side of the LED facing the sun. In both modules red LED's are shining. The red LED's of the right mask are visible in three regions R1, R2, R3, while the left ones are NOT visible at all. This is because of the strong ambient light reflection in the LED reflectors.

Figure 5:
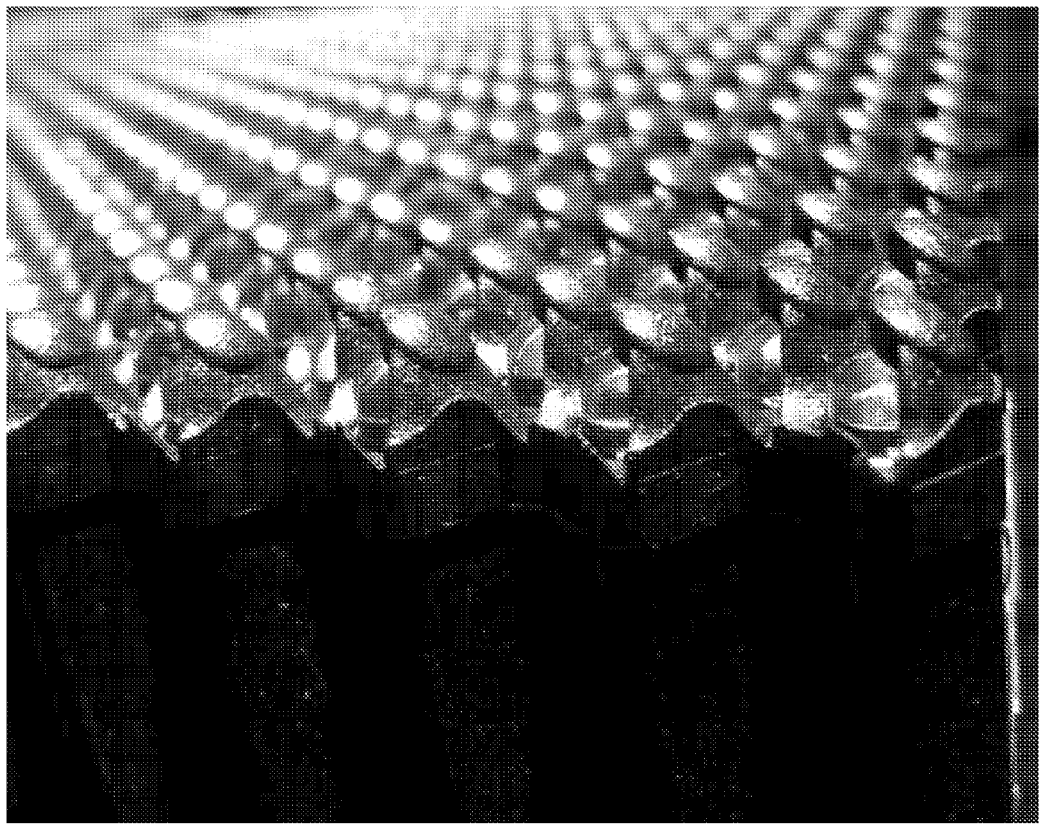
FIG. 5 shows a photograph of a LED matrix module that is covered by a cover mask in accordance with an embodiment of the invention.
Figure 6:
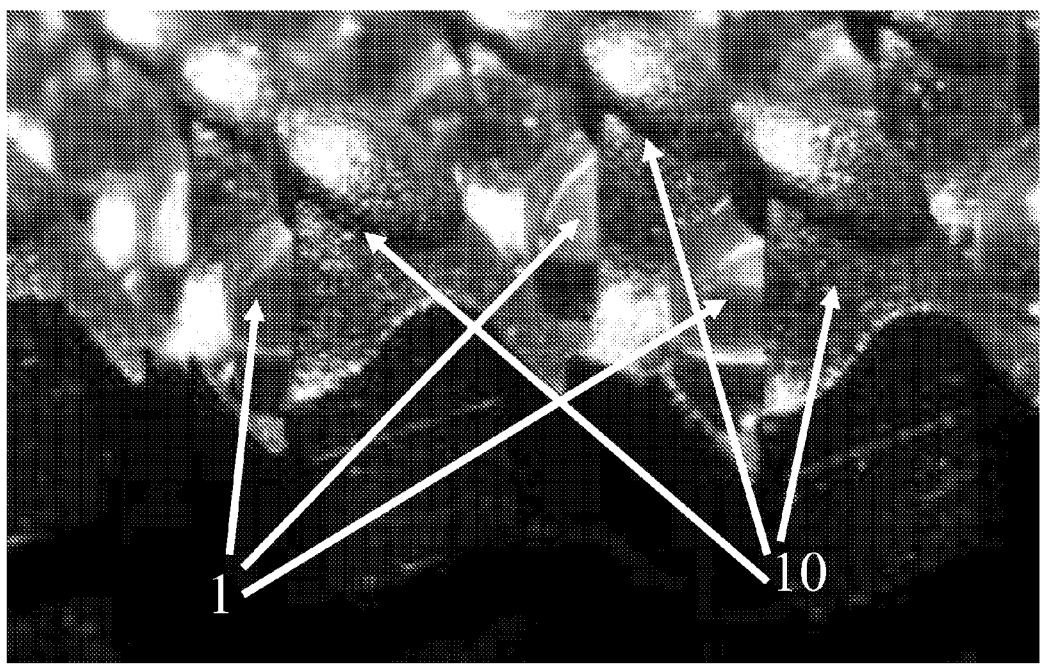
FIG. 6 shows a zoom view of FIG. 5.

FIG. 5 shows a photograph of a LED matrix module that is covered by a cover mask in accordance with an embodiment of the invention. FIG. 6 shows a zoom view of FIG. 5. The photo shows an example of a 40% cover mask with 5 mm LED's as was also used in FIGS. 3 and 4. The photo clearly shows how the cover 10 partially covers each LED 1 individually in a similar manner, i.e. all light distributions are substantially oriented the same. The cover mask can be made of many kinds of material most common is aluminum (using die casting) or polycarbonate (using injection moulding). However, it must be stressed that the invention is not limited to any specific material.

Figure 7:
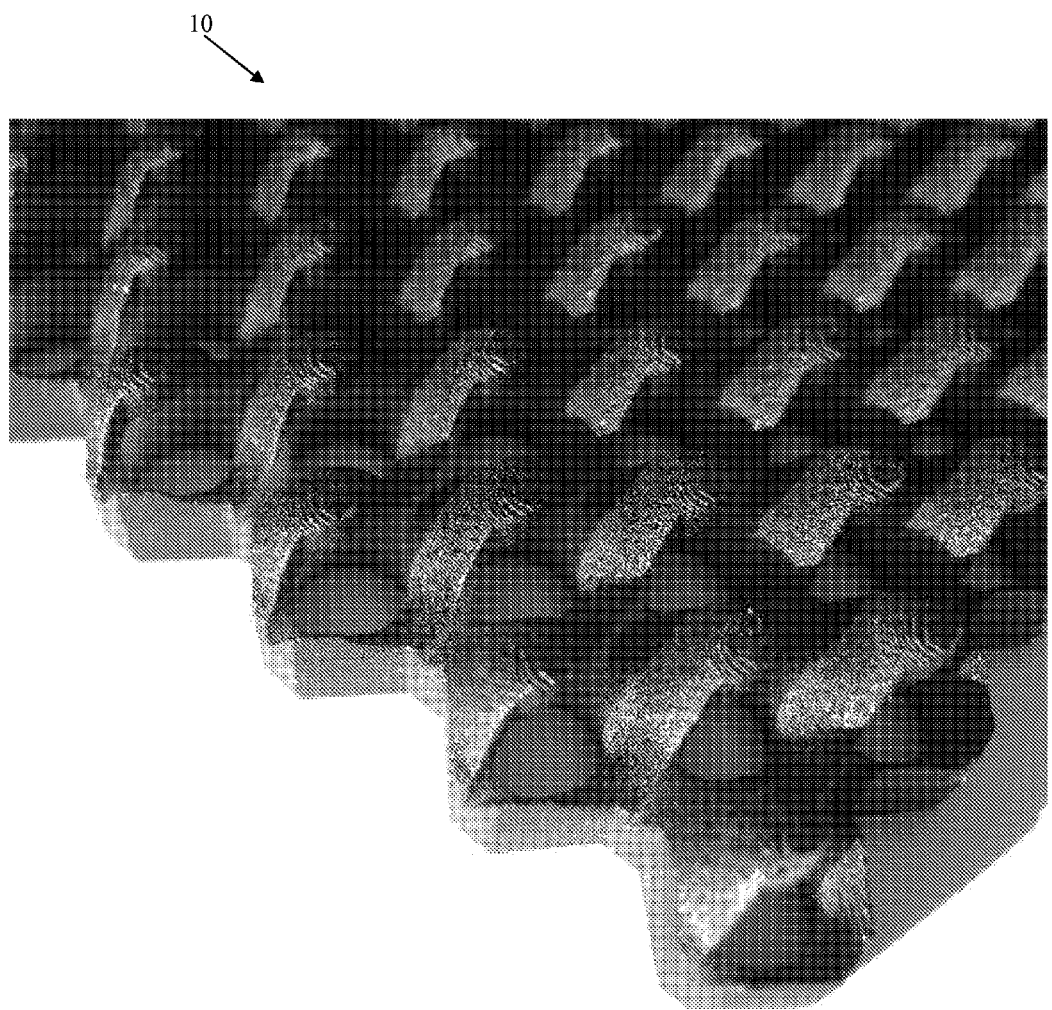
FIG. 7 shows a close-up photograph of the cover mask, which is used in FIG. 5.
Figure 8:
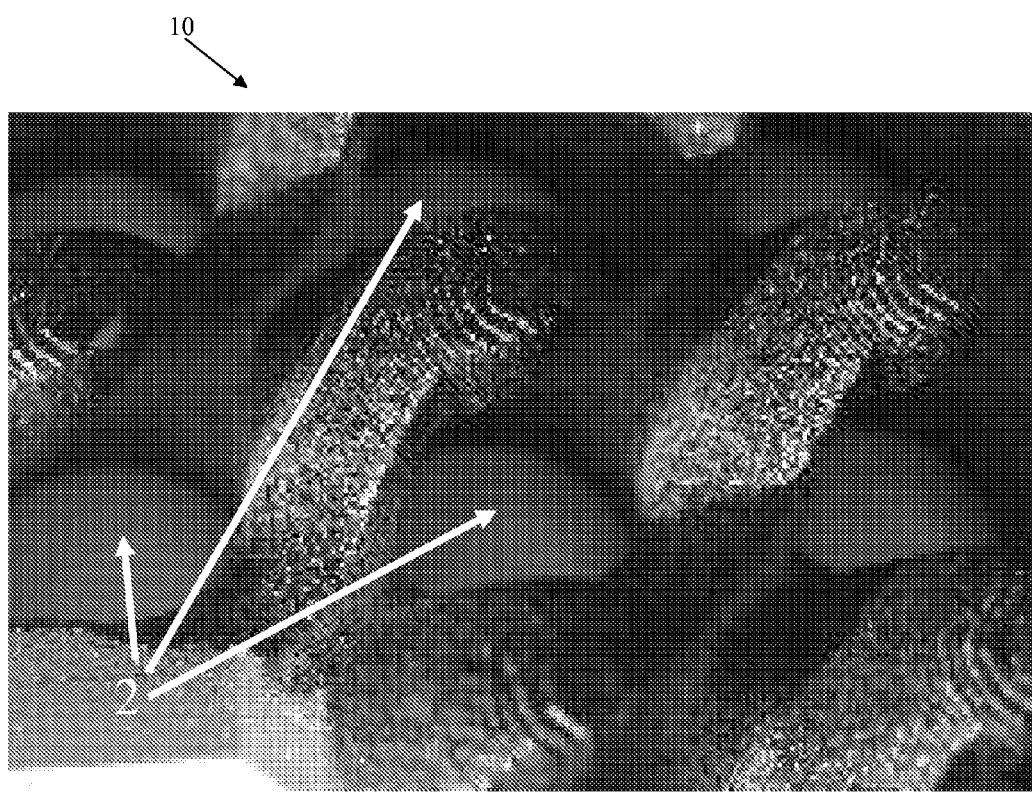
FIG. 8 shows a zoom view of FIG. 7.

FIG. 7 shows a close-up photograph of the cover mask, which is used in FIG. 5. FIG. 8 shows a zoom view of FIG. 7. On this photo it is visible that the front-surface of the cover follows a same contour as the LED's, but also that the surface is of a scattering material. Both aspects are not essential to the invention, but have been proven to provide very high contrast ratios to the viewer. In the zoom view of FIG. 8 the openings 2 for receiving the LED's can be observed.

The benefits and variations of the invention are numerous. A few are listed here.

The invention provides for a dramatically boosted contrast at a same electric current (over a factor of 7 verified in tests but likely can reach over 20* contrast improvement when developed for mass production).

Embodiments of the invention provide for a longer operational life (LED's typically age according to a square of the LED electric current ($I^2$), so a 10* lower LED current means and 100 times longer life, which means hardly any aging).

The longer lifetime implies longer or even no service intervals.

Up to 90% lower current/power consumption can be achieved, which also implies reduced operational costs.

The invention provides for a wider horizontal and vertical view angle than the specified view angle of the LED. The whole LED is visible—at short range the die can be seen through the side of the LED.

In the signaling system of the invention the view angle and uniformity of the LED luminance can be adjusted by covering the right side/angle.

A left-angled or right-angled LED can be made if light pollution is not allowed (wayside signaling in cities).

The invention provides for cost savings, because no optics is required.

The invention provides for a simple construction, easy manufacturing, and low cost.

The invention is light efficient; other prior art systems with lenses may absorb 50% of the light in the optics (all the useful light of the LED is visible).

The embodiment of the invention with LED's constitutes a true solid-state solution with an extreme-long lifespan.

In embodiments of the signaling system of the invention icing has little effect, i.e. it cannot damage the solid-state LED, i.e. an external lens system can be damaged if water penetrated the system (cracks).

The signaling system of the invention is saltwater resistant (saltwater has big impact on external lens based systems).

The signaling system of the invention suffers less from internal pollution, because there are no lenses, i.e. no reduced light output aging after several years.

The signaling system of the invention is environmental friendly, because of the lower power consumption.

The cover mask in accordance with the invention can protect the LED for object impact damages and vandalism (road signs), i.e. the cover mask is a protective half dome.

The cover mask in accordance with the invention will better keep the LED free from snow and ice.

The LED's are covered for direct sun UV so the lens transparent resin (Epoxy or silicone) will not easily age/turn yellow after years.

In the signaling system of the invention light pollution is dramatically reduced, i.e. only down angled light is emitted, while up-angled light it blocked, which is useful in cities and for military tactic indicator/torch lights, and In embodiments that use an internal reflective cover or internal second reflector on the blocking means (such as a mercury vapor mirror or just white paint) the vertical down view angle can be improved for short-range visibility.

Various variations of the signaling system, light-emitting diode, and the blocking means in accordance with the invention are possible and do not depart from the scope of the invention as claimed.

The invention thus provides a signaling system comprising at least one light-emitting device 1 for showing a signal or warning to a viewer, wherein, in operational use, the light-emitting device 1 is configured for emitting radiation with a light distribution forming a solid angle in space, wherein a center line of the solid angle is defined as an optical axis Z of the light-emitting device 1. The light-emitting device 1 comprises a transparent housing 3, a reflector 5 and a light-emitting part 7 arranged within the housing 3, wherein the reflector 5 and the light-emitting part 7 are configured for generating the radiation with said light distribution. The signaling system further comprises blocking means 10 which are arranged substantially at one side of the light-emitting device 1. The blocking means 10 are configured for individually blocking, in operational use, at least part of the radiation emitted by the light-emitting device (1) in a direction substantially parallel to the optical axis Z, wherein the one side is defined with respect to the optical axis Z. The invention further provides various applications of such signaling system. Despite the lower luminance of the light-emitting device, the invention provides for a higher-contrast ratio in case of a low-angled sun with respect to the optical axis Z.

The invention may be applied in various application areas. For example, the invention may be applied in:
1. VMS systems (Variable Message Signs for roads and high-ways) conform the EN12966 standard for the EU and others.
2. Platform displays used for public transport passenger information systems (bus stop, tram and train arrival time information).
3. General outdoor LED information/advertising displays (video and text).
4. Rail signals and level crossing signals.
5. Traffic light signal heads (such as the 3-aspect signal head), pedestrian signal heads and other traffic signals.
6. Turn/brake indicators of cars and other road vehicles.
7. City parking guidance systems (indicating FULL/FREE and the number of available parking lots).
8. Bus/Train destination displays (rolling stock).
9. Free space Optic communication systems (FSO).
10. Optical (like Infra red) active beam detection systems used in machine protection and intruder detection for burglary systems.
11. Military stealth combat lights/indicators invisible from the sky, and
12. All other LED outdoor and indoor indication, information, signaling and display systems.

Most likely many more application areas will be discovered in future.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage. Throughout the Figures, similar or corresponding features are indicated by same reference numerals or labels.

The invention claimed is:

1. A signaling system for being viewed by a viewer in a viewing direction, said signaling system comprising:
    at least one light-emitting device comprising a transparent housing, at least one reflector, and at least one light-emitting part located within a boundary of an interior of said housing defined by a perimeter edge of said housing, wherein said light-emitting device, in operational use, is configured for emitting radiation with a light distribution forming a solid angle in space, said solid angle includes a center line defined as an optical axis of said light-emitting device, said reflector and said light-emitting part being configured for generating said radiation with said light distribution; and
    at least one blocking means arranged substantially on a surface of said transparent housing of said light-emitting device, said blocking means being configured for individually blocking, in operational use, at least part of said radiation emitted by said light-emitting device in a direction substantially parallel to said optical axis, wherein said surface is defined with respect to a fictitious plane through said optical axis.

2. The signaling system as claimed in claim 1, wherein said blocking means is configured for blocking between 1% and 99% of said light distribution.

3. The signaling system as claimed in claim 1, wherein said blocking means is configured for blocking between 30% and 50%.

4. The signaling system according to claim 1, wherein said blocking means is configured for blocking said radiation emitted in directions falling within a solid angle centered around said optical axis and a normal horizontal or vertical viewing angle around said optical axis of said light-emitting device.

5. The signaling system according to claim 1, wherein said blocking means is configured for an adjustable blockage of said light distribution.

6. The signaling system according to claim 1, wherein said blocking means is configured for redirecting incident sunlight in a direction different than said viewing direction.

7. The signaling system according to claim 1, wherein said blocking means is configured for scattering incident sunlight.

8. The signaling system according to claim 1, wherein said blocking means is configured for absorbing incident sunlight.

9. The signaling system according to claim 1, wherein said blocking means further comprising a further reflector at an inner side facing said reflector, said further reflector is configured for reflecting radiation emitted by said light-emitting device towards said reflector.

10. The signaling system according to claim 1, wherein said blocking means is a cover mask that is opaque for visible light, said cover mask is removably attached to an exterior of said transparent housing.

11. The signaling system according to claim 1, wherein said blocking means further comprising a blocking layer that is provided directly on said surface of said transparent housing of said light-emitting device, said blocking layer being opaque for visible light, and wherein said surface is an exterior or interior surface of said transparent housing.

12. The signaling system according to claim 1, wherein said blocking means further comprising a material that is non-reflective and dark-colored in daylight, said material being on a side facing the viewer.

13. The signaling system according to claim 1, wherein said at least one light-emitting device is an array of light-emitting devices for forming a sign or symbol in operational use.

14. The signaling system according to claim 1, wherein said at least one light-emitting device comprises a light-emitting diode.

15. The signaling system according to claim 1, said signaling system being constructed to form a system selected from a group consisting of road side signal, traffic light, traffic warning system, rail level crossing sign, wayside signal, highway information system, advertising display, vehicle turn indicator, vehicle brake light, vehicle tail light, and vehicle navigation light.

16. A signaling device comprising:
at least one light-emitting device comprising a transparent housing, at least one reflector, and at least one light-emitting part arranged within said housing, wherein said light-emitting device, in operational use, is configured for emitting radiation with a light distribution forming a solid angle in space, said solid angle includes a center line defined as an optical axis of said light-emitting device, said reflector and said light-emitting part being configured for generating said radiation with said light distribution; and
at least one light blocking element having a substantially spherical configuration to diffract ambient light in all directions, said light blocking element overlaps with said light-emitting device when projected into a direction of said optical axis onto a surface perpendicular to said optical axis, said light blocking element being arranged substantially at one side of said light-emitting device, said light blocking element being configured for individually blocking, in operational use, at least part of said radiation emitted by said light-emitting device in a direction substantially parallel to said optical axis, wherein said one side is defined with respect to a fictitious plane through said optical axis.

17. The signaling device according to claim 16, wherein said light blocking element includes a portion configured to cover said optical axis of said light-emitting device.

18. The signaling system according to claim 16, wherein said light blocking element is configured for blocking said radiation emitted in directions falling within a solid angle centered around said optical axis and a normal horizontal or vertical viewing angle around said optical axis of said light-emitting device.

19. The signaling system according to claim 16, wherein said light blocking element is configured for redirecting incident sunlight in a direction different than a viewing direction.

20. The signaling system according to claim 16, wherein said light blocking element further comprising a further reflector at an inner side facing said reflector, said further reflector is configured for reflecting radiation emitted by said light-emitting device towards said reflector.

* * * * *